United States Patent
Jang

[11] Patent Number: 6,051,496
[45] Date of Patent: Apr. 18, 2000

[54] USE OF STOP LAYER FOR CHEMICAL MECHANICAL POLISHING OF CU DAMASCENE

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/156,052

[22] Filed: Sep. 17, 1998

[51] Int. Cl.⁷ .................................................. H01L 21/44
[52] U.S. Cl. ........................ 438/687; 438/622; 438/634; 438/624; 438/626; 438/633; 438/637; 438/675; 438/672; 438/666
[58] Field of Search .................................... 438/622, 624, 438/626, 633, 634, 637, 666, 672, 675

[56] References Cited

U.S. PATENT DOCUMENTS

| | | | |
|---|---|---|---|
| 4,702,792 | 10/1987 | Chow et al. | 156/628 |
| 4,789,648 | 12/1988 | Chow et al. | 437/225 |
| 5,173,439 | 12/1992 | Dash et al. | 437/67 |
| 5,262,354 | 11/1993 | Cote et al. | 437/195 |
| 5,618,381 | 4/1997 | Doan et al. | 438/633 |
| 5,731,245 | 3/1998 | Joshi et al. | 438/705 |
| 5,840,625 | 11/1998 | Feldner | 438/626 |
| 5,885,900 | 3/1999 | Schwartz | 438/697 |
| 5,891,804 | 4/1999 | Havemann et al. | 438/674 |
| 5,897,870 | 4/1999 | Joshi et al. | 438/632 |
| 5,904,565 | 5/1999 | Nguyen et al. | 438/687 |
| 5,933,758 | 8/1999 | Jain | 438/687 |
| 5,939,788 | 8/1999 | McTeer | 257/751 |
| 5,942,449 | 8/1999 | Meikle | 438/747 |

OTHER PUBLICATIONS

W.L. Guthrie et al, "Chemical–Mechanical Polishing" Conf. Proceedings ULSI–VII Materials Research Society, 1992.

*Primary Examiner*—Jey Tsai
*Assistant Examiner*—Lynne A. Gurley
*Attorney, Agent, or Firm*—George O. Saile; Stephen B. Ackerman

[57] ABSTRACT

A method is disclosed for forming copper damascene interconnects without the attendant CMP (chemical-mechanical polishing) dishing problem that is encountered in the art. This is accomplished by first lining the inside walls of a dual damascene structure with a diffusion barrier layer, and then depositing copper metal into the damascene structure. Secondly, as a key aspect of the invention, and before removing the excess copper either by conventional etching techniques-which is difficult for copper- or by conventional CMP- which causes dishing in grooves or trenches- an etch stop layer is deposited covering the copper layer. Portions of the etch stop layer is next removed from the high regions of the underlying copper by a quick first CMP so that other portions of the etch stop layer over the wider trenches/ groove remain low and unaffected. The high regions now exposed are etched while the low regions protected by the etch-stop layer still remain unaffected. When the copper etching reaches a level below the level of the low regions, a global CMP is performed so that all of the excess copper is removed and the level of the copper especially over the wider trench areas reaches within very close proximity of the level of the insulation layer surrounding the copper damascene- and without dishing.

30 Claims, 4 Drawing Sheets

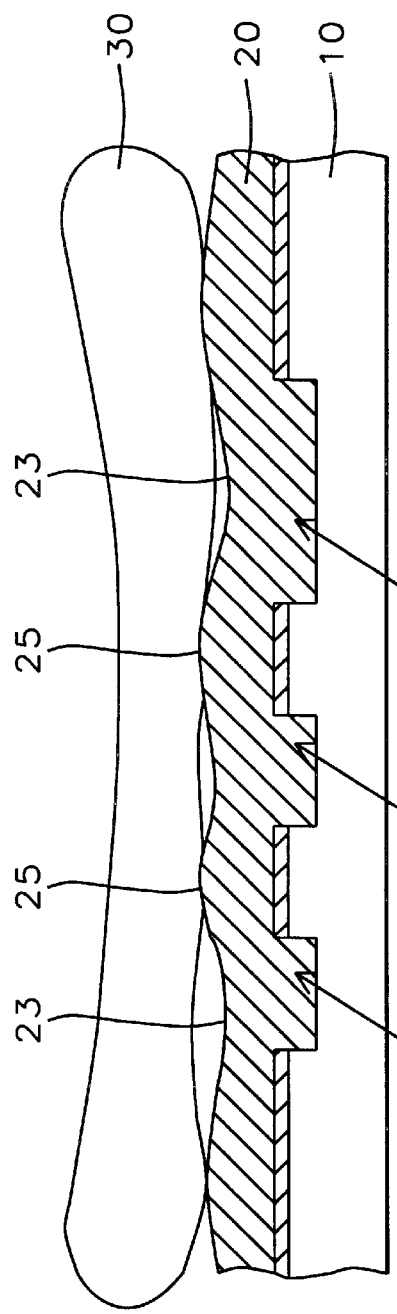
FIG. 1a – Prior Art
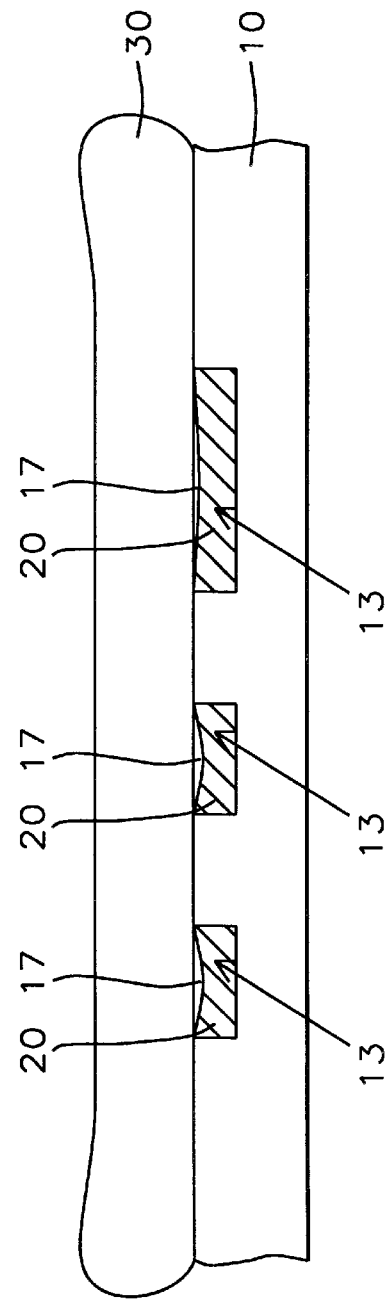
FIG. 1b – Prior Art

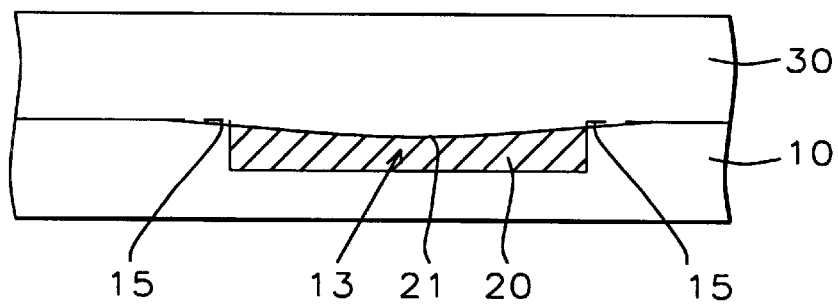
FIG. 1c – Prior Art
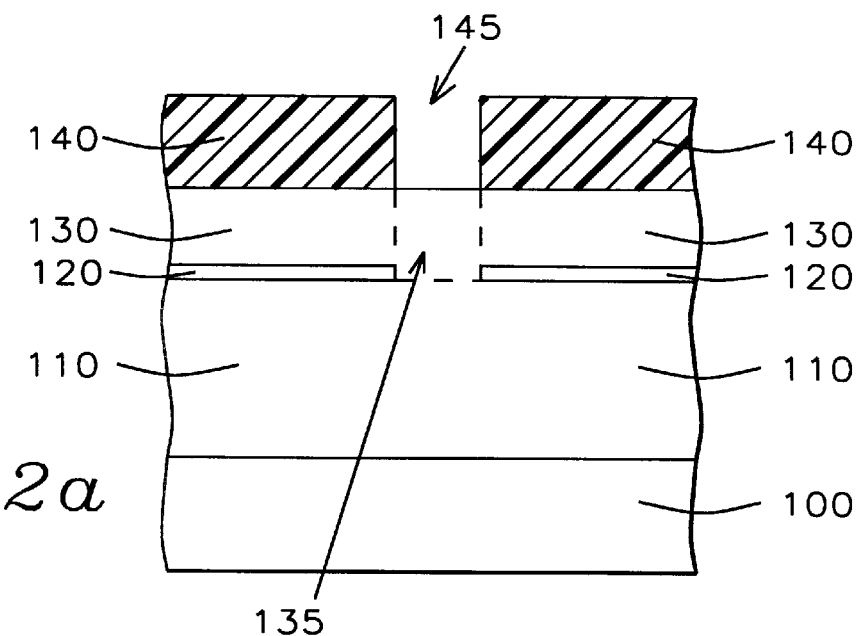
FIG. 2a
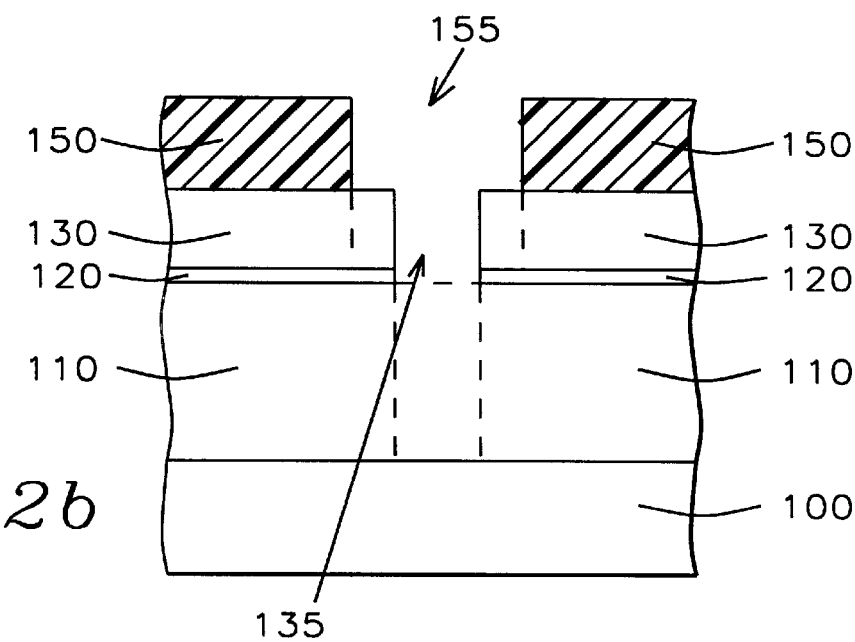
FIG. 2b

USE OF STOP LAYER FOR CHEMICAL MECHANICAL POLISHING OF CU DAMASCENE

BACKGROUND OF THE INVENTION (1) Field of the Invention

The present invention relates to the manufacture of ultra large scale integrated (ULSI) circuit chips in general, and in particular, to a method of using an etch-stop layer in the chemical-mechanical polishing of copper damascene structures in semiconductor substrates.

(2) Description of the Related Art

The use of chemical-mechanical polishing for removing excess copper in a damascene process and the use of damascene process for forming copper interconnects in the first place have evolved almost in a complementary fashion because of the nature of advances in the semiconductor technology. With the advent of very and ultra large scale integration (VLSI and ULSI) circuits, more devices are being packed into the same or smaller areas in a semiconductor substrate. At the same time, low resistance copper interconnects are being used more and more in order to improve further the performance of circuits. More devices in a given area on a substrate require better planarization techniques due to the unevenness of the topography formed by the features themselves, such as metal lines, or of the topography of the layers formed over the features. Because many layers of metals and insulators are formed successively one on top of another, each layer need to be planarized to a high degree if higher resolution lithographic processes are to be used to form smaller and higher number of features on a layer in a semiconductor substrate. Conventionally, etch-back techniques are used to planarize conductive (metal) or non-conductive (insulator) surfaces. However, some important metals, such as gold, silver and copper, which have many desirable characteristics as an interconnect, are not readily amenable to etching, and hence, the need for chemical-mechanical polishing (CMP).

Conventionally, the various metal interconnect layers in a semiconductor substrate are formed separately, and serially. First, a first blanket metal is deposited on a first insulating layer and electrical lines are formed by subtractive etching of the metal through a first mask. A second insulating layer is formed over the first metallized layer, and the second insulating layer is patterned with holes using a second mask. The holes are then filled with metal, thus forming metal columns, or plugs, contacting the first metal layer. A second blanket metal layer is formed over the second insulating layer containing the columnar plugs which now connect the upper second metal layer with the lower first metal layer. The second metal layer is next patterned with another mask to form a set of new electrical lines, and the process is repeated as many times as it is needed to fabricate a semiconductor substrate.

It will be observed that patterning, that is, photolithography and etching of metal layers to form the needed interconnects constitute a significant portion of the process steps of manufacturing semiconductor substrates, and it is known that both photolithography and etching are complicated processes. Furthermore, as already stated, copper is very difficult to etch. This is one of the primary reasons why the current state of very large scale integration (VLSI) employ the use of aluminum for the wiring and tungsten plugs for providing the interconnection between the different levels of wiring. However, since copper has better electromigration property and lower resistivity than aluminum, it is a more preferred material for wiring and plugs than aluminum. In addition, copper has more improved electrical properties over tungsten, making copper a desirable metal for use as plugs as well. Thus, where it was relatively easy to etch aluminum or tungsten after depositing them to form lines or via plugs, substantial additional cost and time are now required to etch copper. Accordingly, chemical-mechanical polishing has become an attractive alternative to etching in removing unwanted copper.

Another method that is especially suited to forming composite copper interconnects, that is, metal lines and plugs together, with minimal etching is the damascene process. In a single damascene process, grooves are formed in an insulating layer and filled with metal to form conductive lines. Dual damascene takes the process one step further in that, in addition to forming the grooves of a single damascene, the conductive hole openings are also formed in the insulating layer. The resulting composite structure of grooves and holes are filled with metal. The excess metal is then removed by chemical-mechanical polishing. The process is repeated as many times as required to form the multi-level interconnections between metal lines and the holes formed in between. Contact holes are formed directly over the substrate where the metal in the hole contacts the surface of the substrate, while the via holes are formed between metal layers. It will be noted that the sequence of first forming the groove in an upper insulating layer and then the hole in the underlying lower insulating layer can be reversed by forming the hole extending downwardly from the upper insulating layer to the bottom of the lower insulating layer and then "enlarging" the hole in the top layer to form the groove in the upper layer. Though each of the two approaches requires modification of some of the steps up to, but not including the last step of polishing, the details of the intermediate steps will not be given here so as to not obscure the understanding of the important step of CMP. An improvement over prior art CMP will be disclosed in the embodiments of the present invention.

As is known in the art, CMP combines a chemical conversion of the surface layer to be removed with a mechanical removal of the converted layer. Ideally, the conversion product should be soft and readily removable to maintain high polishing rates. Because of the chemical nature of the conversion, rate selectivity for metal removal relative to insulator removal can be achieved by incorporating additives in the slurry to either enhance the metal removal and protect the insulator. Manipulation of the chemical component of CMP can be quite involved, while the mechanical component of the polishing mechanism can provide more straight-forward planarization characteristics.

The mechanical kinetics of CMP for a blanket deposited metal in grooves or holes in an insulator is illustrated in FIGS. 1a–1c and explained by the Preston equation given by (see for example, W. L. Guthrie, et al., "Chemical-Mechanical Polishing", Conference Proceedings ULSI-VII, Materials Research Society, 1992):

$$(\Delta H/\Delta t) = K_p(L/A)\,(\Delta s/\Delta t),$$

where
($\Delta H/\Delta t$) is the removal rate of the material in terms of change in height per unit time of polishing, L is the load imposed over a surface area A, ($\Delta s/\Delta t$) is the relative velocity of the pad to the sample, and $K_p$ is Preston's coefficient. The equation predicts that, for a given (L/A), the weight loss of the polished material is proportional to the amount of travel, and it remains invariant with time. The polish rate increases with the pressure (L/A) and velocity. In other words, the removal rate is a linear function of pressure, so that high points are polished more rapidly, and the surface quickly becomes planar. This is shown at points (25) in FIG. 1a.

In FIG. 1a, metal (20) is deposited over an insulator (10) having groove and/or hole recesses (13) as shown. Excess metal is removed by performing mechanical polishing with pad (30) and a slurry, not shown. A slurry for removing tungsten metal, for example, may comprise the combination of two or three ingredients including: 1) a chemical base such as hydrogen peroxide ($H_2O_2$) dissolved in water, 2) an abrasive, such as alumina, silica, or titanium oxide ($TiO_x$ where x equals 1 to 2), and 3) an optional fluid such as ethylene glycol in which the abrasive is suspended. It is to be noted in passing that the Preston equation implies that the removal rate is independent of the abrasive particle size in the slurry. Once the high points are quickly polished, the relatively high pressure at the high points are diminished since the load is now shared by lower points such as (23) which are now within reach of the pad. After total removal of the metal layer (20) from the surface of insulator (10), the polishing is shared between the metal layer that is level with the insulator surface and the insulator itself. Since the polishing rate of the metal is different from that of the insulator, and in the case of copper, faster than that of the insulator, metal is removed from further below the level of the insulator, thus leaving spaces (17) as shown in FIG. 1b. This in turn causes a higher pressure being built up at the edges of the groove/hole openings (13) and (17), and therefore, erosion of the insulator edge, (15). When compounded by the elastic deformation of the polishing pad material as shown in FIG. 1c, polishing continues below the level of the insulator surface, thus causing dishing (21) of the metal surface as shown in FIG. 1c. This in turn results in defects and reliability problems which are alleviated with the proposed method of the present invention.

Dishing can be extensive especially over large grooves or trenches formed in a substrate. For such wide isolation trenches filled with a dielectric material, $SiO_2$, Dash, et al., in U.S. Pat. No. 5,173,439 disclose a method of forming an etch resistant material, polysilicon, over the $SiO_2$, then removing the polysilicon around the $SiO_2$, thus forming a plug comprising $SiO_2$ and polysilicon, and then chemical-mechanical polishing the plug down to the level of the surface of the substrate. Chow, et al., in U.S. Pat. No. 4,702,792, also use CMP in forming fine conductive lines, patterns and connectors; however, in connection with a lift-off mechanism used with a polymer layer having metallized trenches. Joshi, et a., use a tungsten-germanium alloy hard cap as a polish stop in forming high aspect ratio low resistivity lines/vias. In another U.S. Pat. No. 4,789,648, Chow, et al., teach a method for producing coplanar multi-level metal/insulator films on a substrate and for forming patterned conductive lines simultaneously with stud vias by overfilling the channels and via holes with metallization and removing the excess metal by etching or CMP. Also, both Joshi et al., and Cote, et al., show methods of forming a CMP stop layer over a metal layer in a damascene or dual damascene structure in U.S. Pat. Nos. 5,731,245 and 5,262,354.

What is needed is an improvement over prior art methods of forming damascene copper interconnects without dishing defects through a judicious use of a modified CMP process employing a polish stop layer.

SUMMARY OF THE INVENTION

It is therefore an object of the present invention to provide a method of forming damascene copper interconnects with reduced CMP dishing.

It is another object of this invention to provide a method of forming a CMP stop layer over damascene copper interconnects to reduce dishing.

It is yet another object of the present invention to provide a method of chemical-mechanical polishing of features which are low or high, without the detrimental effects of dishing.

These objects are accomplished by first lining the inside walls of a dual damascene structure with a diffusion barrier layer, and then depositing copper metal into the damascene structure. Secondly, as a key aspect of the invention, and before removing the excess copper either by conventional etching techniques—which is difficult for copper—or by conventional CMP—which causes dishing in grooves or trenches- an etch stop layer is deposited covering the copper layer. Portions of the etch stop layer is next removed from the high regions of the underlying copper by a quick first CMP so that other portions of the etch stop layer over the wider trenches/groove remain low and unaffected. The high regions now exposed are etched while the low regions protected by the etch-stop layer still remain unaffected. When the copper etching reaches a level below the level of the low regions, a global CMP is performed so that all of the excess copper is removed and the level of the copper especially over the wider trench areas reaches within very close proximity of the level of the insulation layer surrounding the copper damascene- and without dishing.

More specifically, the objects are accomplished by providing a semiconductor substrate having a substructure comprising devices formed in said substrate and a metal layer formed thereon; forming a dual damascene structure having a groove and a hole over said substructure; forming a barrier layer covering said substrate including the inside walls of said damascene structure; forming metal in said damascene structure; forming an etch-stop layer over said substrate covering said metal; performing a first chemical-mechanical polishing of said substrate to remove said etch-stop layer from higher regions and expose underlying said metal forming exposed regions while leaving said etch-stop layer as a protective layer over lower regions on said substrate; etching said metal in said exposed regions; and performing a second chemical-mechanical polishing for global planarization of said substrate.

BRIEF DESCRIPTION OF THE DRAWINGS

In the drawings that follow, similar numerals are used referring to similar parts throughout the several views.

FIG. 1a shows the removal of excess metal formed over recesses in an insulating layer by chemical-mechanical polishing, according to prior art.

FIG. 1b shows the planarization of the metal and insulating layer of FIG. 1a by chemical-mechanical polishing, according to prior art.

FIG. 1c shows the dishing of metal in recesses of FIG. 1b during the chemical-mechanical polishing of prior art.

FIG. 2a shows the forming of dual damascene structure by the opening of a hole pattern in the semiconductor substrate of this invention.

FIG. 2b shows the forming of dual damascene structure by the opening of a groove pattern in the semiconductor substrate of FIG. 2a of this invention.

DESCRIPTION OF THE PREFERRED EMBODIMENTS

Figure 2C:
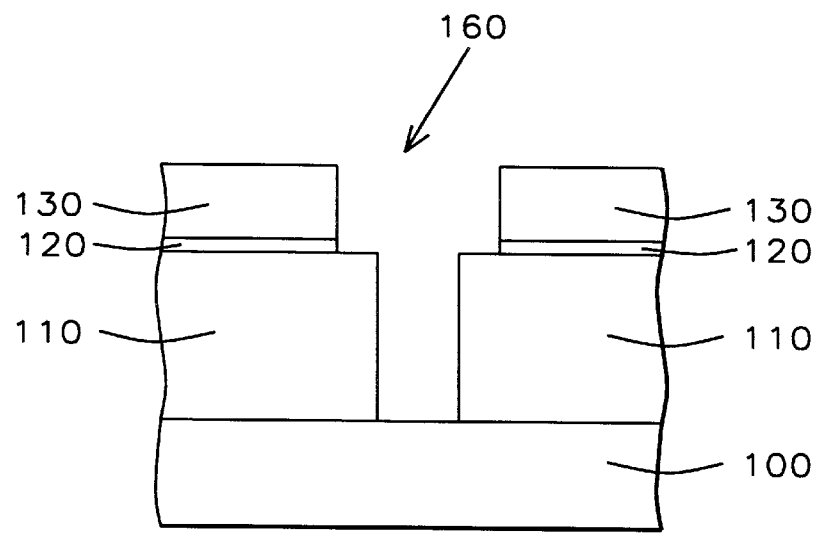
FIG. 2c shows the completed dual damascene structure of this invention.

Referring now the drawings, in particular to FIGS. 2a–2c, and FIGS. 3a–3d, there is shown a method of forming a copper damascene interconnect with reduced dishing effect copper damascene interconnect with reduced dishing effect after having been subjected to chemical-mechanical polishing. Specifically, FIGS. 2a–2c show the forming of a composite damascene structure of this invention, while FIGS. 3a–3d show the forming of the copper interconnect in the composite structure.

In FIG. 2a, a semiconductor substrate (100), having a substructure of devices and/or metal layer (not shown), is provided. As the substructure is not significant to the invention, it is not described in detail in order not to unnecessarily obscure the present invention.

Two insulating layers of dielectric, namely, a lower layer dielectric (LLD), (110), and an upper layer (ULD), (130), are formed over substrate (100) with an intervening etch-stop layer (120). Usually, a dielectric layer is referred to as an interlevel dielectric (ILD) layer when formed over a semiconductor surface, such as silicon, and as an intermetal dielectric (IMD) layer when formed over a metal layer substructure. The present disclosure provides for copper interconnects reaching either a semiconductor substructure exposed under a contact hole, or a metal substructure under a via hole, and therefore, the more general terms LLD and ULD will be used to distinguish the two layers of dielectric, and the term "hole" to refer to either contact or via holes.

Dielectric layers are known in the art. Both lower (LLD) and upper (ULD) layers shown in FIG. 2a may be formed from materials including but not limited to silicon oxide materials, silicon nitride materials, and silicon oxynitrides materials formed within integrated circuits through methods including but not limited do CVD, PECVD, PVD sputtering methods. For the preferred embodiment of the present invention, LLD layer (110) comprises an oxide or a polymer having a thickness between about 5000 to 8000 angstroms (Å), an ULD LAYER (130) also comprises an oxide or a polymer with a thickness between about 5000 to 9000 Å.

Etch-stop layer (120) is a thin conformal material which can be silicon nitride ($Si_3N_4$, SiN), silicon oxynitride ($SiO_xN_y$), and titanium nitride (TiN). Silicon nitride is preferred for this embodiment because it has high selectivity to the etchant used in etching the dielectric layers. SiN is formed by reacting dichlorosilane ($SiCl_2H_2$) with ammonia ($NH_3$) in an PECVD at a temperature between about 360 to 440° C. and at a flow rate between about 50 to 100 standard cubic centimeters per minute (sccm), and with a thickness between about 1000 to 2000 Å.

After the forming of LLD, ULD and etch-stop layer, a first photoresist layer (140) of a thickness between about 1.0 to 1.2 μm is formed and then patterned with a mask having either a via or contact hole pattern (145), as shown in FIG. 2a. The hole pattern is next etched into the ULD and etch-stop layer (120) as shown in FIG. 2a, forming hole (135) in respective layers (130) and (120). It is preferred that the etching of ULD layer (130) and etch-stop layer (120) is performed with recipe comprising gas $C_4F_8$ at a flow rate between about 3 to 11 sccm, and modified to etch stop layer (120) with gas $CH_3F$ at a flow rate between about 8 to 22 sccm. Subsequent to forming hole pattern (135) in the substrate as shown in FIG. 2a, first photoresist layer (140) is removed by employing oxygen plasma ashing.

Next, a second photoresist layer (150) is formed over the substrate including the previously formed hole pattern (135). The second photoresist layer is patterned with the image of a conductive line using a photomask, and the conductive line pattern is etched into ULD layer, (130), as shown in FIG. (2b) to form conductive line groove (155). At the same time the conductive line groove is formed in ULD layer (130), hole pattern (135) is transferred, by the same etching process, into LLD layer (110). It is preferred that the etching of the lower level dielectric layer is accomplished with recipe comprising gas $C_4F_8$ at a flow rate between about 3 to 11 sccm. Thus, a composite hole and groove damascene structure, shown with reference numeral (160) in FIG. 2c, is formed, after which the second photoresist layer is removed.

At the next step, the walls of the composite damascene structure (160), including the bottom wall, are covered with a barrier layer, layer (115) in FIG. 3a, which will later serve as a diffusion barrier to copper, as is known in the art. It is preferred that the barrier material is tantalum (Ta) and that it has a thickness between about 150 to 300 Å.

Figure 3A:
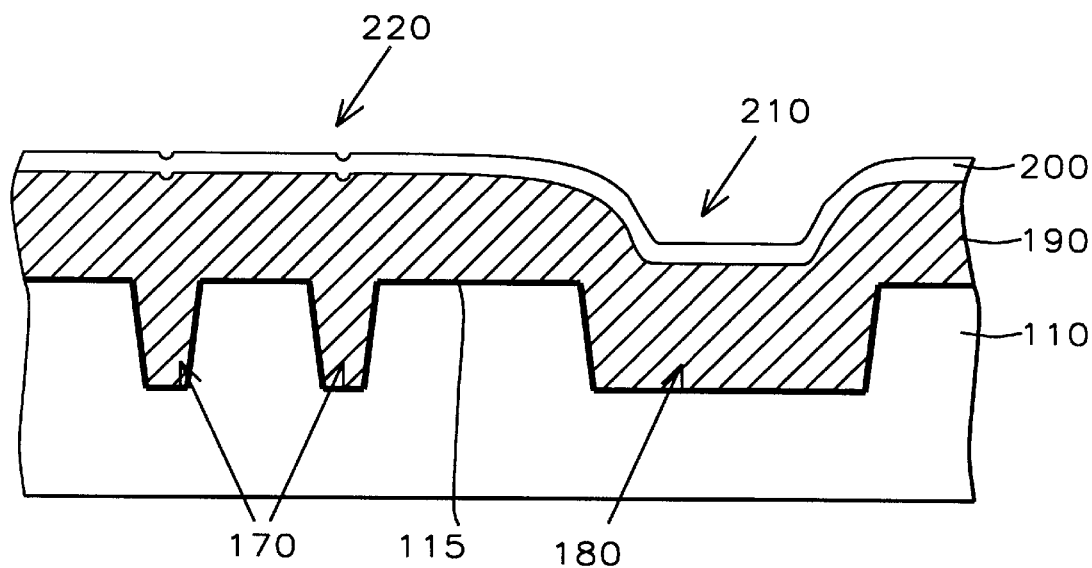
FIG. 3a shows the forming of copper metal in the damascene structure of this invention, and the deposition of an etch-stop layer thereover.
Figure 3B:
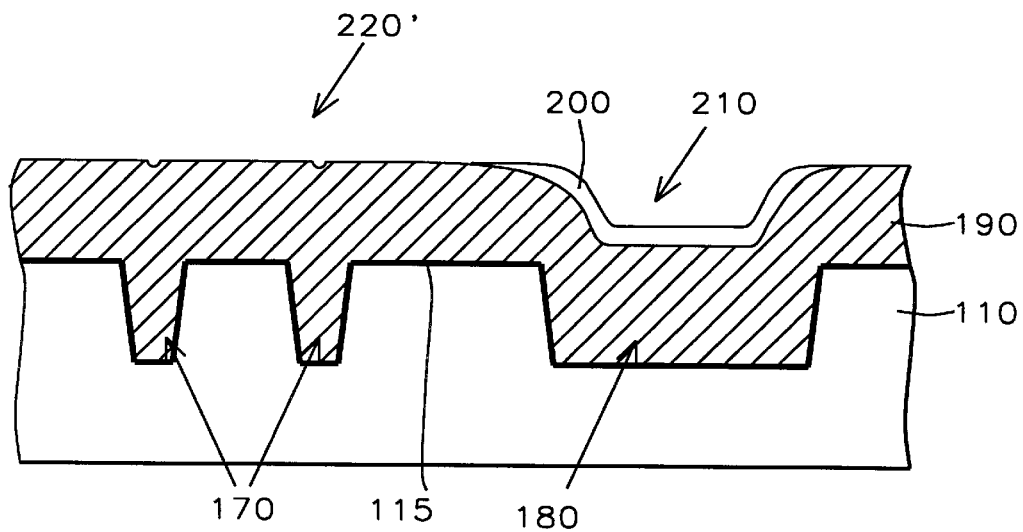
FIG. 3b shows the partial chemical-mechanical polishing of the etch-stop layer of FIG. 3a from the high regions of the underlying copper metal of this invention, thus forming exposed copper regions, while leaving copper in the lower regions over wide trenches/groove unaffected.

FIG. 3a shows other portions of substrate (100) of FIG. 2c where narrow (170) and wide (180) grooves have been formed, which, when filled with metal, will serve as damascene interconnects. Thus, copper (190) is deposited over substrate (100) incorporating the composite damascene structure using either electro-chemical or electroless deposition process. The topographical features of the underlying damascene structure will determine the undulations of the deposited copper thereover, having high regions (220) and low regions (210), as shown in FIG. 3a. Usually, wide grooves (180) will project lower regions (210) in comparison with those corresponding to the narrower (170) grooves.

As a main feature and key aspect of the present invention, a second etch-stop layer, (200), is deposited covering the copper damascene as shown in FIG. 3a. The second etch-stop material is selected from a group consisting of tantalum, tantalum nitride, tungsten nitride and titanium nitride. In this embodiment, tantalum nitride (TaN) is preferred and has a thickness between about 300 to 800 Å. It will be noted from FIG. 3a that tantalum nitride is conformal and reproduces the low and high regions, (210) and (220), respectively. At the next step, the substrate is subjected to a short chemical-mechanical polishing (CMP) so that the etch-stop layer (200) is removed from the high regions (220), thereby leaving those regions exposed (220') to the underlying copper metal. This first and short CMP is accomplished with a slurry comprising $Al_2O_3$ abrasives, $H_2O_2$, deionized water and other ingredients, and for a duration of between about 4 to 6 minutes. Thus, during the short time the first CMP is performed, the polishing action is more local in that the polishing pad does not reach all the way down to the lower regions, such as (210) in FIG. 3b, and the tantalum nitride layer remains unaffected in the low regions. This is important because, at the next step where exposed regions (220') will be etched, the lower regions will be protected by the etch-stop layer, namely, tantalum nitride.

Figure 3C:
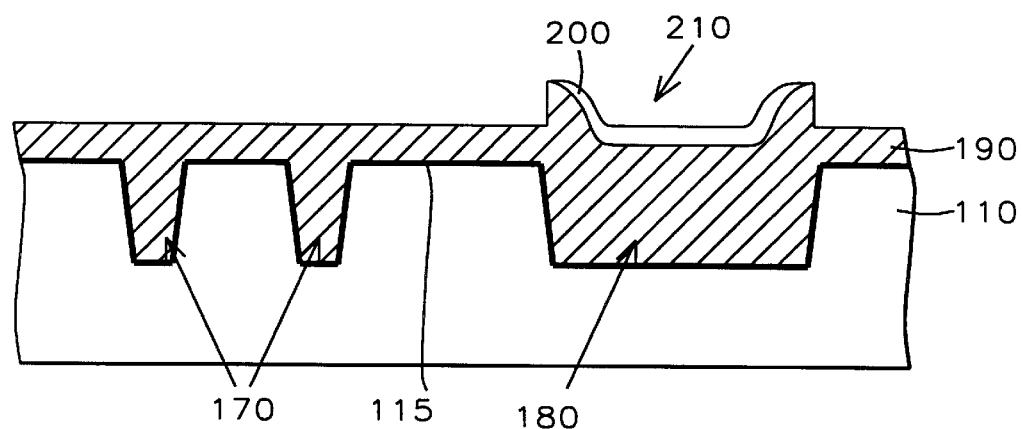
FIG. 3c shows the selective etching of the exposed copper regions of FIG. 3b until levels corresponding to the elevations below the lower regions are reached, according to this invention.

The etching of high, exposed regions (220') can be accomplished by either wet etch or dry reactive ion etch (RIE) and it is preferred that the recipe comprises $HNO_3$ and $H_2O$. The etching is continued until an elevation corresponding to the level of the bottom of the low regions (210) is reached as shown in FIG. 3c.

Figure 3D:
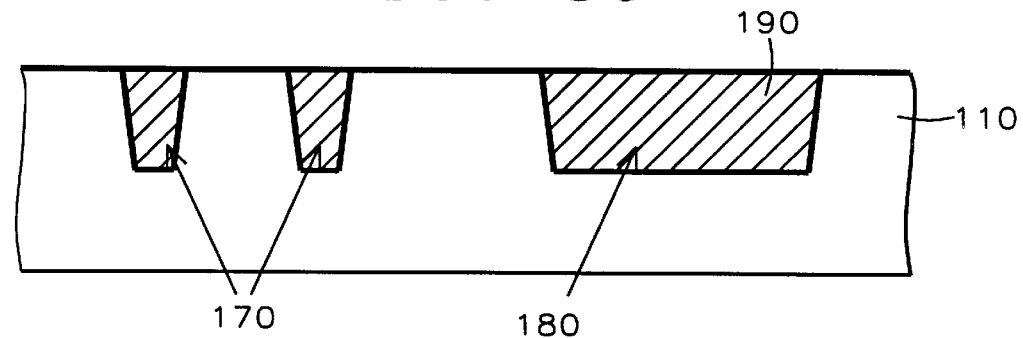
FIG. 3d shows the damascene structure of FIG. 3c after having been subjected to global chemical-mechanical polishing of this invention without the detrimental effects of dishing.

It will be appreciated that by having copper removed from high regions, and protecting copper in the lower but wider regions with layer (200), the otherwise CMP dishing over the wide grooves is ostensibly prevented because the etch-stop layer tantalum nitride, being harder than copper, retards the chemical-mechanical removal to the extent that when the edges of the grooves are reached, copper in the grooves is left in close proximity to the level of the surface of insulating layer (110) as shown in FIG. 3d. The second global CMP to achieve the planarization shown in FIG. 3d is accomplished with a slurry comprising $Al_2O_3$, $H_2O_2$ and deionized water.

It will also be appreciated by those skilled in the art that the method disclosed in this invention provides several advantages. Firstly, a layer, namely, tantalum, is used as a barrier to copper diffusion in an insulating layer. Secondly, an etch-stop layer is introduced with which to combine judiciously the use of etching techniques with those of chemical-mechanical polishing in forming a new copper damascene without the detrimental dishing features encountered in the art. Wet or dry etch is applied only to high regions for a limited extent since it is difficult to etch copper, but at the same time for a sufficient amount so as to enable chemical-mechanical polishing without causing dishing in trenches or grooves.

Though these numerous details have been set forth here, such as specific materials, process parameters, etc., in order to provide an understanding of the present invention, exact details need not be employed to practice the present invention. Thus, one may form the composite groove/hole in the copper damascene structure by first forming the groove opening and the hole opening. It is also possible to omit the etch-stop layer in the forming of the damascene structure, by using timed-etch, when applied with the present invention. One may also choose titanium nitride, as the second etch-stop material.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of using an etch-stop layer for chemical-mechanical polishing (CMP) of copper damascene comprising the steps of:

providing a semiconductor substrate having a substructure comprising devices formed in said substrate and a metal layer formed thereon;

forming a lower level dielectric (LLD) layer over said substrate;

forming a first etch-stop layer over said LLD layer;

forming an upper level dielectric (ULD) layer over said first etch-stop layer;

forming a first photoresist layer over said ULD layer;

patterning said first photoresist layer with a hole pattern;

etching through said hole pattern in said first photoresist layer into said ULD layer;

etching further said hole pattern into said first etch-stop layer;

removing said first photoresist layer from said substrate;

forming a second photoresist layer over said substrate including said hole pattern;

patterning said second photoresist layer with a conductive line groove pattern;

etching through said conductive line groove in said second photoresist layer into said ULD layer until first etch-stop layer is reached;

etching further and transferring said hole pattern from said ULD layer into said LLD layer until a lower level said substructure of said substrate is reached thus forming a composite groove/hole structure;

removing said second photoresist layer;

forming a barrier layer covering said substrate including the inside walls of said composite groove/hole structure;

forming metal in said composite groove/hole structure;

forming a second etch-stop layer over said substrate covering said metal;

performing a first chemical-mechanical polishing of said substrate to remove said second etch-stop layer from higher regions and expose underlying said metal forming exposed regions while leaving said second etch-stop layer as a protective layer over lower regions on said substrate;

etching said metal in said exposed regions; and performing a second chemical-mechanical polishing for global planarization of said substrate.

2. The method of claim 1, wherein said LLD layer comprises oxide or polymer.

3. The method of claim 1, wherein said LLD layer has a thickness between about 5000 to 8000 Å.

4. The method of claim 1, wherein said forming said first etch-stop layer over said LLD layer is accomplished by reacting dichlorosilane ($SiCl_2H_2$) with ammonia ($NH_3$) in an LPCVD at a temperature between about 360 to 440° C.

5. The method of claim 1, wherein said ULD layer comprises oxide or polymer.

6. The method of claim 1, wherein said ULD layer has a thickness between about 5000 to 9000 Å.

7. The method of claim 1, wherein said first photoresist layer over said ULD layer has a thickness between about 1.0 to 1.2 micrometers ($\mu$m).

8. The method of claim 1, wherein said patterning said first photoresist layer is accomplished with a photomask having said hole pattern.

9. The method of claim 1, wherein said etching through said hole pattern in said first photoresist layer into said ULD layer is accomplished with a recipe comprising gas $C_4F_8$ at a flow rate between about 4 to 10 sccm.

10. The method of claim 1, wherein said etching further said hole pattern into said first etch-stop layer is accomplished with a recipe comprising gas $CH_3F$ at a flow rate between about 10 to 20 sccm.

11. The method of claim 1, wherein said first photoresist layer is removed by oxygen plasma ashing.

12. The method of claim 1, wherein said patterning said second photoresist layer is accomplished with a photomask having said conductive line groove pattern.

13. The method of claim 1, wherein said etching through said conductive line groove in said second photoresist layer into said LLD layer until said first etch-stop layer is reached is accomplished with a recipe comprising gas $C_4F_8$ at a flow rate between about 4 to 10 sccm.

14. The method of claim 1, wherein said etching further and transferring from said ULD layer said hole pattern into said LLD layer until a lower level said substructure of said substrate is reached is accomplished with a recipe comprising $C_4F_8$ at a flow rate between about 3 to 11 sccm.

15. The method of claim 1, wherein said removing said second photoresist layer is accomplished with oxygen plasma ashing.

16. The method of claim 1, wherein said forming a barrier covering said substrate including the inside walls of said composite groove/hole structure is accomplished by depositing Ta.

17. The method of claim 1, wherein said barrier layer has a thickness between about 150 to 300 Å.

18. The method of claim 1, wherein said forming metal in said composite groove/hole structure over said barrier layer is accomplished by depositing tungsten or copper.

19. The method of claim 1, wherein said forming a second etch-stop layer over said substrate covering said metal is accomplished by depositing a material from a group comprising Ta, TaN, Ti or TiN.

20. The method of claim 1, wherein said performing said first chemical-mechanical polishing to form said exposed regions is accomplished with a slurry comprising $Al_2O_3$ abrasives, water and deionized water.

21. The method of claim 1, wherein said etching said metal in said exposed regions is accomplished with a recipe comprising $HNO_3$ and $H_2O$.

22. The method of claim 1, wherein said performing said second chemical-mechanical polishing is accomplished with a slurry comprising $Al_2O_3$ abrasives, $H_2O_2$ and $H_2O$.

23. A method of using an etch-stop layer for chemical-mechanical polishing (CMP) of copper damascene comprising the steps of:

providing a semiconductor substrate having a substructure comprising devices formed in said substrate and a metal layer formed thereon;

forming a dual damascene structure having a groove and a hole over said substructure;

forming a barrier layer covering said substrate including the inside walls of said damascene structure;

forming metal in said damascene structure;

forming an etch-stop layer over said substrate covering said metal;

performing a first chemical-mechanical polishing of said substrate to remove said etch-stop layer from higher regions and expose underlying said metal forming exposed regions while leaving said etch-stop layer as a protective layer over lower regions on said substrate;

etching said metal in said exposed regions; and performing a second chemical-mechanical polishing for global planarization of said substrate.

24. The method of claim 23, wherein said forming a barrier covering said substrate including the inside walls of said damascene structure is accomplished by depositing Ta.

25. The method of claim 23, wherein said barrier layer has a thickness between about 150 to 300 Å.

26. The method of claim 23, wherein said forming metal in said damascene structure over said barrier layer is accomplished by depositing tungsten or copper.

27. The method of claim 23, wherein said forming an etch-stop layer over said substrate covering said metal is accomplished by depositing a material from a group comprising Ta, TaN, Ti or TiN.

28. The method of claim 23, wherein said performing said first chemical-mechanical polishing to form said exposed regions is accomplished with a slurry comprising $Al_2O_3$ abrasives, $H_2O_2$ and deionized water.

29. The method of claim 23, wherein said etching said metal in said exposed regions is accomplished with a recipe comprising $HNO_3$ and $H_2O$.

30. The method of claim 23, wherein said performing said second chemical-mechanical polishing is accomplished with a slurry comprising $Al_2O_2$ abrasives, $H_2O_2$ and deionized water.

* * * * *